United States Patent [19]

Kawakami

[11] Patent Number: 4,598,243

[45] Date of Patent: Jul. 1, 1986

[54] DIRECT-CURRENT POWER SUPPLY WITH ALARM INDICATOR

[75] Inventor: Chikuni Kawakami, Kaisei, Japan

[73] Assignee: Fuji Photo Film Co., Ltd., Kanagawa, Japan

[21] Appl. No.: 674,014

[22] Filed: Nov. 23, 1984

[30] Foreign Application Priority Data

Dec. 6, 1983 [JP] Japan ................. 58-229112

[51] Int. Cl.$^4$ .................. G05F 1/46; G01N 27/46
[52] U.S. Cl. .................. 323/349; 323/281; 320/48; 340/636
[58] Field of Search ........... 323/275, 281, 349, 351; 320/43, 48; 340/509, 636, 660; 307/43, 72, 74-75, 80, 85-86

[56] References Cited

U.S. PATENT DOCUMENTS

| 4,020,414 | 4/1977 | Paredes | 320/48 X |
| 4,321,525 | 3/1982 | Imazeki et al. | 323/281 |
| 4,349,777 | 9/1982 | Mitamura | 323/281 X |
| 4,413,234 | 11/1983 | Lupoli | 340/636 X |

FOREIGN PATENT DOCUMENTS

| 0078212 | 5/1983 | Japan | 323/281 |
| 0857950 | 8/1981 | U.S.S.R. | 323/281 |

*Primary Examiner*—Peter S. Wong
*Attorney, Agent, or Firm*—Birch, Stewart, Kolasch & Birch

[57] ABSTRACT

A direct-current power supply for supplying electric current to a load and operable with a plurality of types of batteries includes a housing unit for loading therein batteries employed, a monitor device for monitoring a voltage output from batteries in use, an indicator for indicating a warning, a comparing device which compares the monitored voltage with a reference voltage to energize the indicator when the monitored voltage becomes lower than the reference voltage, a voltage generating unit for generating a plurality of voltages as the reference voltages associated with the types of batteries available, and a selecting unit for selectively supplying one of the plurality of voltages generated to the comparing device. Each of the plurality of voltages is set to a value higher than a limit voltage which is sufficiently low for allowing an normal operation of the load.

7 Claims, 10 Drawing Figures

DIRECT-CURRENT POWER SUPPLY WITH ALARM INDICATOR

BACKGROUND OF THE INVENTION

1. Field of the Invention

The present invention relates to a direct-current power supply, and in particular to a direct-current power supply which is powered by batteries.

2. Description of the Prior Art

In general, a secondary battery such as a Ni-Cd alkaline battery can be economically ulilized for a long time period due to its repeatedly rechargeable feature. Although the characteristic of the voltage supplied from a Ni-Cd alkaline battery does not significantly change while it is being used, its output voltage has a tendency to rapidly decrease around the time it has almost exhausted the electric charge accumulated therein. In contrast with such a secondary battery, although a primary battery has a lower unit price, it cannot be recharged; and as a result, the running cost required for employing it for apparatus is soared. The output voltage characteristic of such a primary battery is such that the output voltage develops a high value at the beginning of the battery utilization time period and it tends to proportionally decrease as the time elapses.

From an economical point of view, it is advantageous to employ Ni-Cd alkaline batteries in a portable camera, for example, a handy video camera or an electronic still camera. As described before, however, a Ni-Cd battery has the output voltage characteristic indicating an abrupt drop in the output voltage, which may lower at an unexpected time and may cause to lose a chance to shoot an important scene. In order to avoid such an disadvantageous accident, it will be advantageous to configure apparatus to include an emergency countermeasure for temporarily utilizing an ordinary primary battery, such as an alkaline-manganese battery.

For above-stated portable cameras, it is generally preferable to dispose therein alarm means for notifying beforehand that the voltage supplied from a battery has been lowered. The time for activating the alarm means is usually set in such a manner that the output voltage at the alarm point is slightly higher than the battery output voltage which is sufficiently low for allowing the normal operation of the apparatus. In such apparatus which allows both Ni-Cd alkaline batteries and alkaline-manganese batteries to be employed, however, there exists a remarkable discrepancy between the time periods required for these two types of batteries to reach the limit voltage after they are decreased to the alarm point for alarming the lowered output voltage condition.

Between a case in which Ni-Cd alkaline batteries are utilized to power an electronic still camera and a case in which alkaline-manganese batteries are employed for the same purpose, even if the same shooting condition is established in these cases, that is, even if the shutter is released under the same condition after the disk of camera has been driven into rotation at a predetermined rotating speed for a period of time, then there exists a difference of time period equivant to approximately 40 picture frames taken during the time period measured from when the alarm is generated in response to the battery voltage reaching the preset alarm voltage to when the limit voltage is reached in both cases.

This implies that, when alkaline-manganese batteries are temporarily employed for an electronic still camera designed to be operated by use of Ni-Cd alkaline batteries as its standard power source, 40 picture frames can be taken by the time when the limit voltage is reached after the alarm condition takes place. It can be readily imagined that the 40 frames are greater in number than required for nonprofessionals to shoot pictures.

SUMMARY OF THE INVENTION

It is therefore an object of the present invention to provide a direct-current power supply which is free from the drawbacks of the prior art, and in which the time period to be elapsed from when an alarm takes place for a lowered battery output voltage to when the limit voltage for degrading the normal operation of a utility device powered by the direct-current power supply apparatus is not greatly changed depending on the types of the batteries involved.

In accordance with the present invention, a direct-current power supply apparatus for supplying electric current to a load, a plurality of types of batteries being applicable to the apparatus, includes housing means for installing therein a battery employed, monitor means for monitoring an output voltage supplied from the battery installed, indicator means for indicating an alarm condition of the battery installed, comparing means for comparing the output voltage monitored with a reference voltage to energize the indicator means when the monitored voltage becomes lower than the reference voltage, voltage generating means for generating a plurality of voltages as the reference voltages associated with the plurality of types of applicable batteries, and selecting means for supplying selectively one of the plurality of voltages generated to the comparing means, the plurality of voltages each being set to a value higher than a limit value which is sufficiently low for allowing the normal operation of the load.

BRIEF DESCRIPTION OF THE DRAWINGS

The objects and features of the present invention will become more apparent from the consideration of the following detailed description taken in conjunction with the accompanying drawings in which.

DETAILED DESCRIPTION OF THE PREFERRED EMBODIMENTS

By referring to the accompanying drawings, embodiments of a direct-current power supply will be described in detail in accordance with the present invention.

Figure 1:
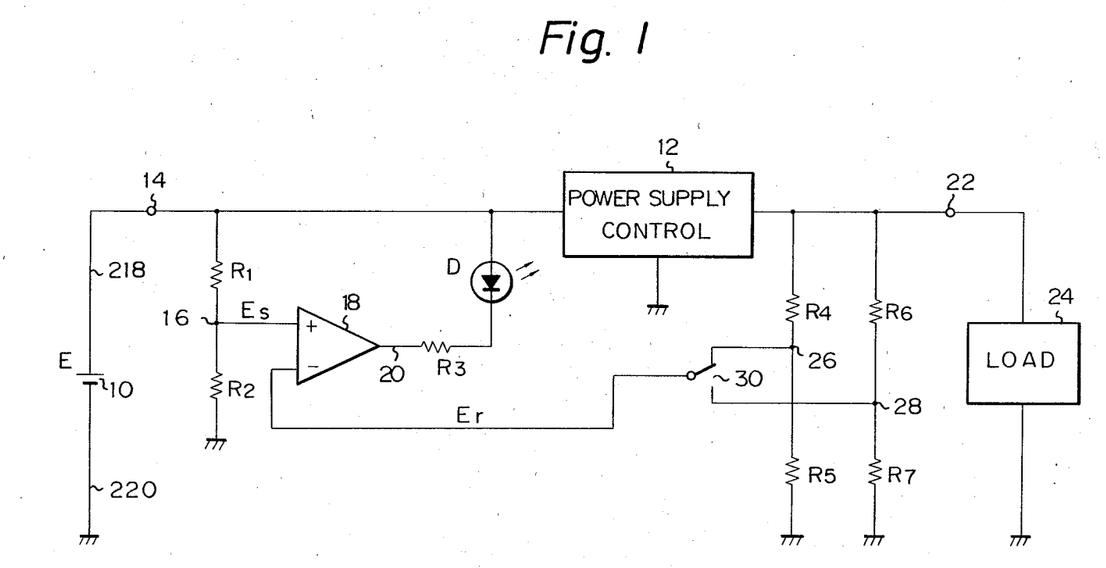
FIG. 1 is a schematic circuit block diagram depicting an embodiment of a direct-current power supply in accordance with the present invention.

Referring to FIG. 1, an embodiment of a direct-current power supply of the present invention comprises battery means 10, which may include Ni-Cd alkaline batteries or alkaline-manganese batteries, and a power supply control 12 including a regulator circuit. In this embodiment, the battery means 10 comprises four units of batteries connected in series, and are conceptually demountably connected between a terminal 14 and the ground.

The terminal 14 is connected to an input of a power supply control 12, a resistor R1, and a light emitting device D such as a light emitting diode. The resistor R1 is grounded via a resistor R2. An interconnecting point of both resistors is linked with a noninverting input (+) of an operational amplifier 18. Consequently, a voltage Es at the interconnecting point 16 of a voltage dividing circuit, comprising the resistors R1 and R2, is proportional to an output voltage E of the power supply 10. In other words, the output voltage E of the battery means 10 is monitored by the operational amplifier 18. The operational amplifier 18 has an output 20 connected to the light emitting diode D through a resistor R3.

The power supply control 12 has an output connected to a power output terminal 22 of the apparatus, which may be linked with a load 24 such as circuitry of an electronic still camera.

The output 22 of the power supply control 12 is also connected to resistors R4 and R6, which are respectively grounded through resistors R5 and R7, each configuring a voltage dividing circuit. These voltage dividing circuits have taps 26 and 28, respectively, which are connected to an inverting input (−) of the operational amplifier 18 via a changeover switch 30, as depicted in FIG. 1.

Two voltage dividing circuits comprising R4 to R7 develop a function to supply two kinds of reference voltages Er to the inverting input (−) of the operational amplifier 18. On the other hand, the operational amplifier 18 forms a comparator which compares these reference voltages Er with the voltage at the interconnecting point 16 of the voltage dividing circuit comprising resistors R1 and R2. If the voltage at the interconnecting point 16 is lower than the reference voltage Er, then the output 20 is set to its high level; otherwise, it is set to its low level. As a result, when the output 20 is at its low level, a driving current flows into the light emitting diode D to enable it.

As will be clear from the explanation given later, the light emitting diode D is utilized to issue a visible alarm announcing that the output voltage E from the battery means 10 is sooner or later lowered to the voltage that degrades the operation of the load 24. Together with, or in place of, such visible alarm means, an audible alarm means may also be employed, for example, by use of a piezoelectric tone generating device.

For the resistances R4 to R7 comprizing voltage dividing circuits, respectively in this embodiment, the ratios between R4 and R5 and those between R6 and R7 are set pursuant to the types of battery means 10.

Figure 2:
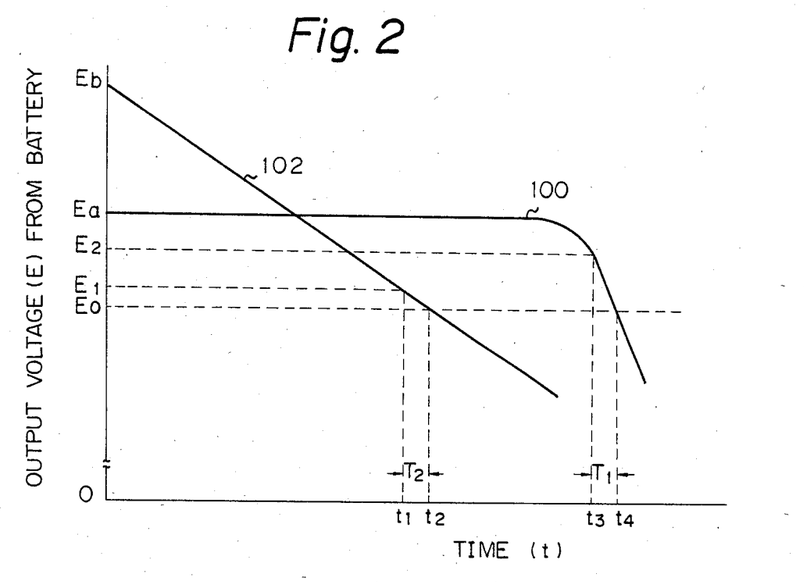
FIG. 2 is a graph plotting the change with respect to time in the output voltages from Ni-Cd alkaline and alkaline-manganese batteries, respectively.

As indicated by a curve 100 in FIG. 2, for example, if the battery means 10 comprises Ni-Cd alkaline batteries, the output voltage E therefrom retains a substantially constant value Ea beginning from the start of battery utilization, and is abruptly lowered just before the neighborhood of the lower limit of the storage capacity. For example, if the limit voltage for the normal operation of an electronic still camera as the load 24 is assumed to be E0, an alarm voltage E2 will be set so as to generate an alarm, at the time point that is advanced by a predetermined time period T1 from the time when the alarm voltage E2 is reached.

As indicated by a substantially direct line 102 in FIG. 2, if the battery means 10 comprises alkalinemanganese batteries, the output voltage E therefrom is reduced at a constant rate starting from an initial value Eb. An alarm voltage E1 will be also set in order to generate an alarm at the time that is advanced by a predetermined time perior T2 from the time when the limit voltage E0 for enabling the normal operation of the load is reached. The reference voltage Er to be supplied to the inverting input (−) of the operational amplifier 18 is set by the voltage dividing circuits comprising resistors R4 to R7 so as to correspond to the alarm voltages E1 and E2. It is operationally advantageous for the apparatus utilized as the load 24 to select the alarm voltages E1 and E2 in such a manner that there does not exist substantially a great difference between the time periods T1 and T2.

As an example for an electronic still camera, if the battery means 10 comprises four units connected in series; Ea, Eb, and E0 are approximately 4.8 volts, 6.0 volts, and 4.0 volts, respectively. In this case, if parameters of the circuitry depicted in FIG. 1 are set so that E1 and E2 become approximately 4.2 V and 4.5 V, respectively, the time difference between time t1 and time t3 is equivalent to about 40 frames of picture from the beginning of the battery utilization. This result is obtained when the same conditions are set for both cases. Naturally, the magnetic disk of the camera is beforehand activated, and a certain period of time is elapsed after the magnetic disk becomes rotating at the preset rotation speed, which is sufficient for enabling the camera to shoot a picture, then the shutter is released in this case.

In FIG. 1, the switch 30 changes its contact point according to the type of the battery means 10 utilized. For example, if Ni-Cd alkaline batteries are employed, the switch 30 is set as illustrated in FIG. 1, and hence the voltage at the interconnecting point 26 is applied as the reference voltage Er to the inverting input (−) of the operational amplifier 18. If alkaline-manganese batteries are used, the switch 30 changes its contact to the opposite side, thus the voltage at the interconnecting point 28 is applied as the reference voltage Er to the inverting input (−) of the operational amplifier 18.

A manual changeover switch may be employed as the switch 30. In this case, the switch 30 is manually operated depending on the type of the battery means installed in this apparatus so that the associated reference voltage is applied to the inverting input (−) of the operational amplifier 18.

Figure 3:
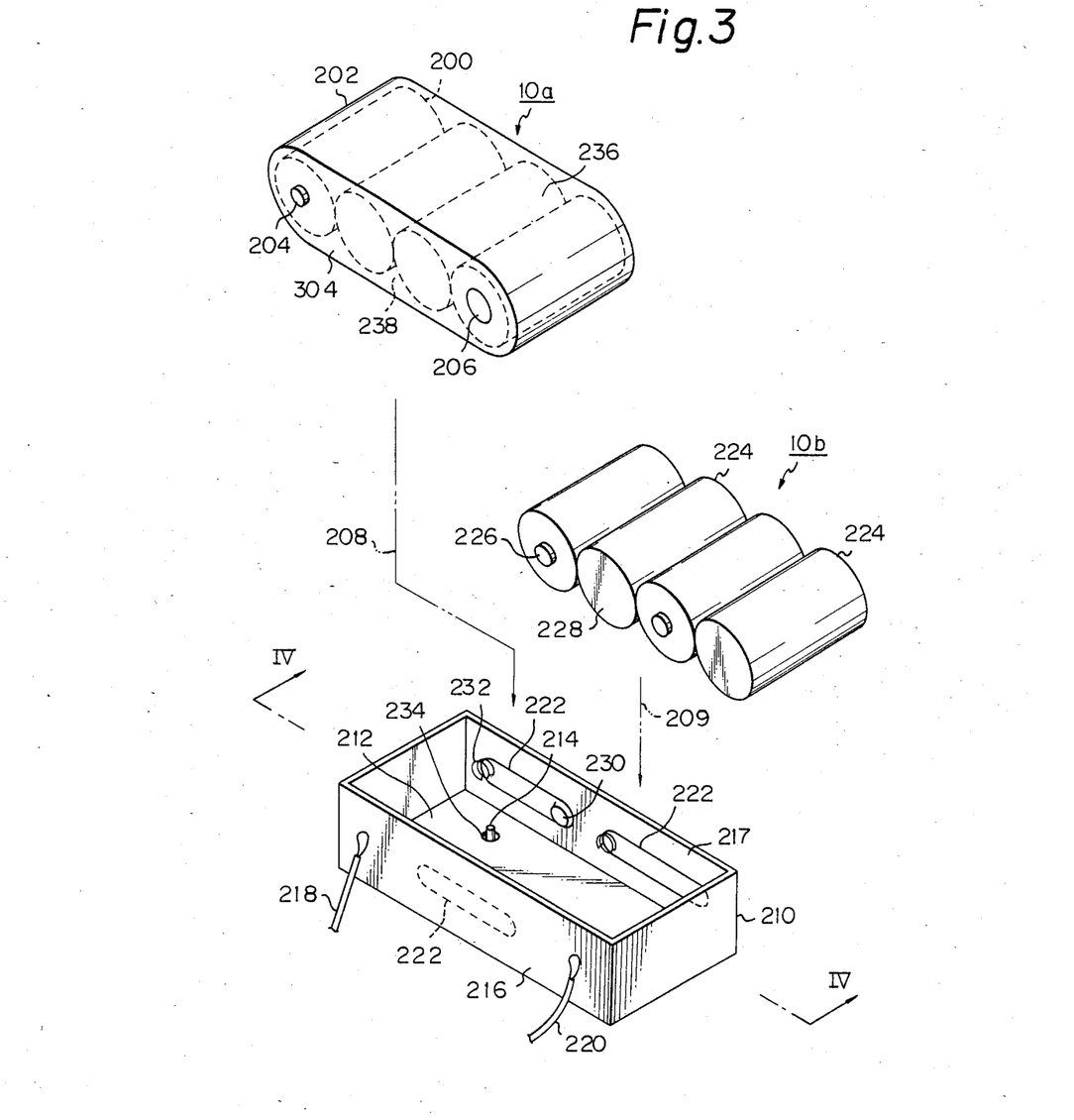
FIG. 3 is a perspective view conceptually depicting an embodiment of the apparatus in accordance with the present invention.

FIG. 3 illustrates an embodiment of the present invention in which the changeover of the switch 30 is automatically carried out in response to the battery means 10 loaded in this apparatus. A battery means 10a comprises an insulating package 202, and four units of Ni-Cd alkaline batteries 200 housed in the insulating package 202, each battery being connected in series and having the rated output voltage of 1.2 volts. The battery means 10a can be connected to an external circuit by use of a positive contact 204 and a negative contact 206, and is installed in a battery casing 210 as indicated by a two-dot chain arrow 208.

Figure 4A:
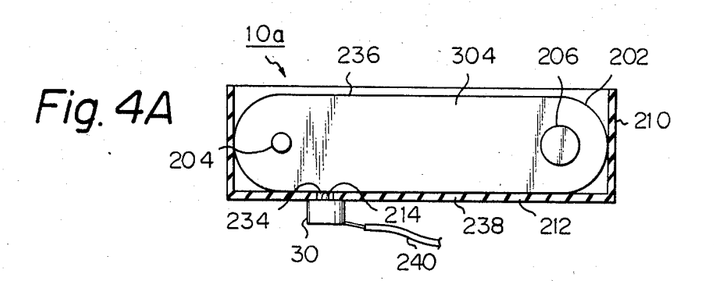
FIGS. 4A and 4B are cross-sectional views useful for understanding the embodiment depicted in FIG. 3, in which the cross sections are illustrated along a dot chain line IV—IV shown in FIG. 3.

The casing 210 made of an insulating material possesses a battery storing function, and is loaded in a utility device, such as an electronic still camera. As depicted in FIG. 4A, a couple of contacts are disposed on a side wall 216 of the casing 210 so as to be brought into contact with the contacts 204 and 206, respectively, when the Ni-Cd battery means 10a is mounted on the casing 210. Two lead wires 218 and 220 are connected to the two contacts on the side wall 216, respectively. As illustrated in FIG. 1, these lead wires 218 and 220 are further linked with a terminal 14 and the ground, respectively.

A connecting member made of a conductor is disposed on an inner side of a side wall member 216 of the casing 210 as indicated by dotted lines, while two similar connecting members 222 are disposed on the inner side of the other side wall 217 opposing to the side wall member 216. The connecting member 221 has a projection 230 to be brought into contact with the positive electrode 226 of the alkaline manganese battery means 10b, and spring means 232 to be brought into contact with the negative contact 228 of the battery means 10b. The projection 230 and the spring means 232 are arranged so that the four separate units 224 installed in the alkaline manganese battery means 10b are connected in series in the casing 218 when the battery means 10b is installed in the casing 218, as indicated by a two-dot chain line 209.

In this embodiment, the casing has an opening 234 disposed in a bottom member 212 thereof, and a switch 30 is arranged on the outer side of the opening 234. The switch 30 comprises a slidable rod 214 projecting toward the inside of the casing 210, as depicted in FIG. 3. As can be seen from FIG. 4B, the switch 30 is located at such a position that the rod 214 can slide inwardly between two adjacent units 244 without any obstruction when the alkaline manganese battery means 10b is correctly installed in the casing 210. A package 202 of Ni-Cd alkaline batteries 10a has such a shape that an upper surface 236 and a bottom surface 238 are flat as illustrated in FIG. 4A. When the Ni-Cd battery means 10 is installed at a proper location in the casing 210, as depicted in FIG. 4A, the rod 214 is pushed downward in this figure by a part of the flat bottom surface 238.

Figure 4B:
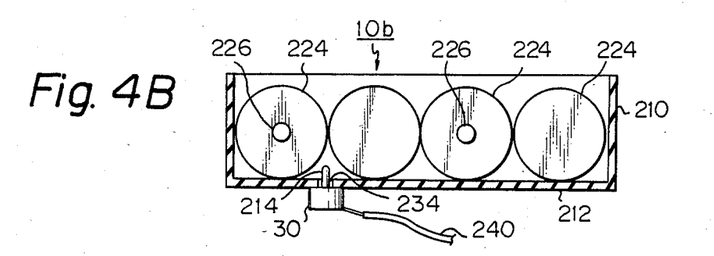

The switch 30 has a lead wire 240 to be connected to the circuit depicted in FIG. 1. In this case, the switch 30 may be a changeover switch having mechanical contacts, and is connected to the inverting input (−) of the operational amplifier 18 and the connecting point 26 or 28. Consequently, when the rod 214 is pushed upward as shown in FIG. 4B, the switch 30 of FIG. 1 is set to the connecting state which is opposite to that shown in this schematic circuit diagram, so the reference voltage of the alkaline-manganese battery means 10b corresponding to the warning voltage E1 is applied to the inverting input (−) of the operational amplifier. When the rod 214 is at its lower position, that is, the rod 214 is pushed downward, the switch 30 is set as illustrated in FIG. 1, and hence the reference voltage Er of the Al-Cd alkaline battery means 10a associated with the warning voltage E2 is applied to the inverting input (−) of the operational amplifier 18.

As described above, the reference voltage Er associated with the type of batteries loaded in this apparatus is applied to the inverting input (−) of the operational amplifier 18, the operational amplifier 18, which compares the voltage applied to the inverting input (−) with the voltage Es obtained by dividing the power supply voltage E, is allowed to turn on the light emitting diode D at the warning voltage E2 for the Ni-Cd alkaline battery means 10a, and at the warning voltage E1 for the alkaline-manganese battery means 10b, respectively. The time periods T1 and T2 between when the warning voltage is reached and when the limit voltage E0 is developed are, in practice, not so significantly different depending on the types of batteries employed.

Figure 5A:
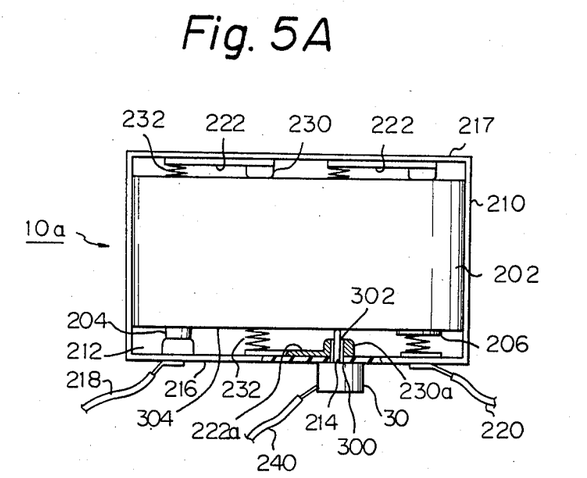
FIGS. 5A and 5B are front views, partially broken, illustrating other alternative embodiments of the present invention.
Figure 5B:
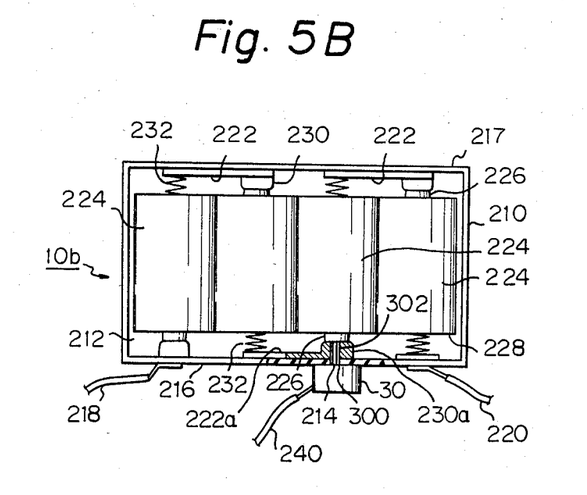

FIGS. 5A and 5B depict other alternative embodiments of the present invention, in which the similar components are denoted with the same reference numerals. In these embodiments, the switch 30 is arranged on a side wall member 216 of the casing 210, not on the bottom member 212 thereof. Or, the switch 30 may be mounted on a side wall member 217 opposing the side wall member 216.

A connecting member 222a is made of a conductor having the similar shape to the other connecting members 222, and comprises spring means 232 and a protrusion 230a. The protrusion 230a has a shape of a frustrum substantially the same as a cylinder with a hole 302 passing therethrough at a location including the center axis of the frustrum. The side wall member 216 is also provided with a hole 300 corresponding to the hole 302.

The switch 30 is arranged so as to allow the slidable rod 214 made of an insulator to smoothly pass through the holes 302 and 300. As can be seen from FIG. 5B, therefore, when the alkaline-manganese battery means 10b is installed in the correct location in the casing 210, the protrusion 230a is brought into contact with the positive contact 226 of the corresponding unit 244, so the rod 214 is depressed downward in this figure. As can be clear from FIG. 5A, when the Ni-Cd alkaline battery means 10a is properly mounted in the casing 210, the rod 214 is set to the upper position because there does not exist any protrusion at a location corresponding to the protrusion 230a on a side wall of the package 202. Consequently, the circuit of FIG. 1 can perform the same operation as the embodiment of FIG. 3 since the rod 214 moves up and down as described above.

Figure 6:
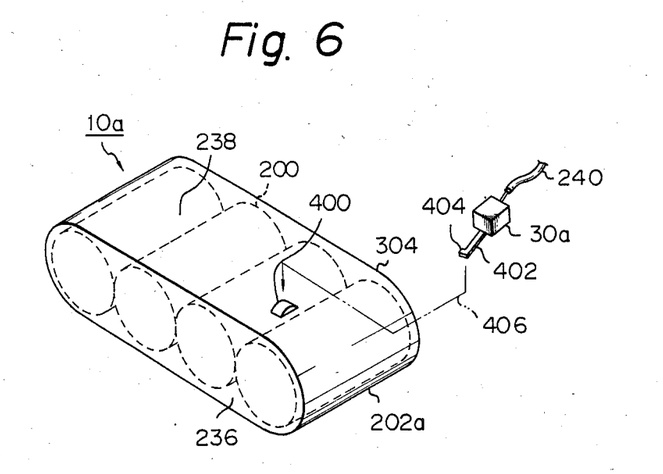
FIGS. 6, 7 and 8 are perspective views depicting still other embodiments in accordance with the present invention.

FIG. 6 depicts another embodiment of the apparatus in accordance with the present invention. This embodiment could correspond to that of FIG. 3 which would be modified to dispose the package 202 upside down. There is provided a protrusion 400 in a portion of a primary surface 238 of a package 202a opposing another primary surface 236 thereof. The Ni-Cd alkaline battery means 10a is installed in a casing similar to the casing 210, and a switch 30a is disposed in the same way as for the embodiment shown in FIG. 3 at a location corresponding to the protrusion 400 of the bottom member 212 when the battery means 10a is mounted in the casing in the correct state. In more detail, a hole corresponding to the shape of the protrusion 400 is disposed in the bottom member 212, and the switch 30a is so arranged as to allow an end 404 of an arm 402 thereof to be housed in the hole, thereby enabling the arm 402 to move smoothly.

The switch 30a may be of the same kind as the switch 30. In this embodiment, however, a movable arm 402 is employed in place of the rod 214. As conceptually indicated by an arrow 406, when the Ni-Cd alkaline battery means 10a is correctly installed in the casing, the end 404 is brought into contact with the protrusion 400 and is pushed thereby upward. On the other hand, even when the alkaline-manganese battery means 10b is mounted at the normal position in the casing, the arm 402 of the switch 30a is kept placed at the lower position in the figure because there exists no provision corresponding to the protrusion 400.

Figure 7:
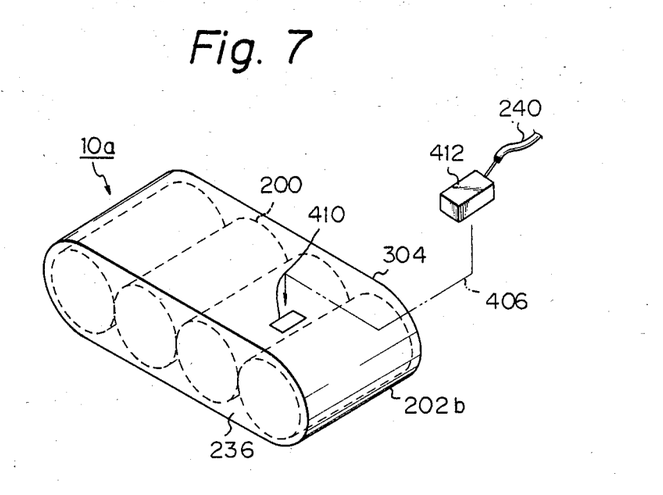

FIG. 7 depicts still another embodiment of the apparatus in accordance with the present invention. In this embodiment, a package 202b is provided in the same way as the package in FIG. 6, and has a primary surface 238 disposed on which is an identifying member 410. Such Ni-Cd battery means 10a is mounted in a casing similar to the casing 210, and a switch 412 is arranged in the same way as depicted in FIG. 3 at a location, corresponding to the identifying member 410, in the bottom member 212 when the battery means 10a is installed in the casing in the normal state. In more detail, a hole corresponding to the shape of the identifying member 410 is disposed in the bottom member 212, and a sensing section of the switch fixedly arranged on the bottom surface of the bottom member 212 is housed in the hole.

A thin conductor plate may be employed as the identifying member 410. In this case, the switch 412 may be configured to be responsive to the existence of the identifying member 410 when two separate contacts, for example, are brought into contact with the conductor plate. Alternatively, a thin magnetic plate may be adopted as the identifying member 400. In this case, the switch 412 may be provided with a mechanism such as a Hall-effect device to detect the magnetic plate.

When the Ni-Cd alkaline battery means 10a is normally installed in the casing as conceptually indicated with an arrow 406, the sensor section of the switch 412 detects the identifying member. On the other hand, when the alkaline-manganese battery means 10b is mounted at the correct position in the casing, the switch 412 detects the absence of the identifying member 410 because there does not exist any provision corresponding to the identifying member 410.

In the embodiments of FIGS. 6 and 7, the packages 202a and 202b need not be necessarily utilized. For example, means similar to the protrusion 400 or the identifying member 410 may be arranged directly on the unit 200 of the battery means 10a.

Figure 8:
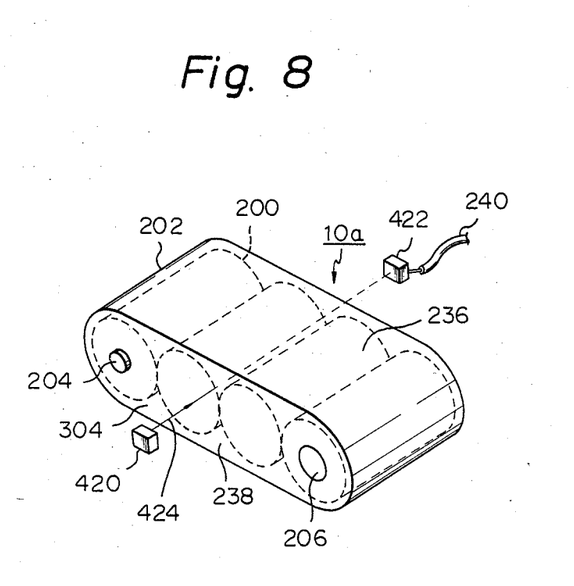

FIG. 8 shows still another embodiment of the present invention in which an optical system is employed to detect whether or not the package 202 is installed in the casing 210. A light source 420 is disposed on one of the side wall members 216 and 217 of the casing 210, while a photosensitive device 422, such as a phototransistor, is arranged as a switch means at the corresponding position on the other side wall member. These constituents form shape determining means for determining the differences in shape of the package 202 and the battery unit 224.

The light source 420 and the photosensitive device 422 are arranged in such a positional relationship that a light beam 424 emitted from the light source 420 reaches the photosensitive device 422 if the package is not present in the casing 210, and the light 424 irradiated from the light source 420 is prevented from entering the photosensitive device 422 by a side wall 304 of the package 202 when the package 202 is correctly mounted in the casing 210.

Consequently, when the Ni-Cd battery means 10a is properly installed, the incident light to the photosensitive means 422 is blocked so that the switch 30 is set to the state depicted in FIG. 1. When the alkaline-manganese battery means 10b is conectly mounted, the light 424 from the light source 420 passes through a space between units 224 of the battery means 10b to reach the photosensitive device 422, hence rendering the switch 30 to be set to the connecting state opposite to the state shown in FIG. 1. As described above, the reference voltage applied to the comparator 18 is changed depending on the battery types.

In the embodiments of FIGS. 7 and 8, the switch 30 depicted in FIG. 1 can be advantageously configured with a binary-state device, such as a relay or a transistor, responsive to the switch 412 or 422. The lead wire 240 of the switch 412 or 422 is thus connected to such a binary-state device. The detecting devices such as the switches 30, 412, and 422 may operate based on any operational principles if they develop a function to identify the types of the batteries utilized. That is, in addition to those described above, any such detecting devices that operate based on other electromagnetic or chemical principles may be employed.

In accordance with the present invention, the warning voltage with respect to the battery power consumption is set to be variable depending on the types of the batteries employed, as described above. Consequently, the time period to be elapsed from when the warning for the consumed battery power is indicated to when the limit voltage for allowing the normal operation of utility apparatus can be set without a great discrepancy depending on the types of batteries utilized.

What is claimed is:

1. A direct-current power supply apparatus for supplying electric current to a load, a plurality of types of batteries being applicable to said apparatus, comprising:
   housing means for installing therein a battery employed;
   monitor means for monitoring a voltage output from the battery installed;
   indicator means for indicating a warning condition of the battery installed;
   comparing means for comparing the voltage monitored with a reference voltage to energize said indicator means when the monitored voltage becomes lower than the reference voltage;
   voltage generating means for generating a plurality of voltages as the reference voltages associated with said types of batteries available; and
   selecting means for selectively supplying one of the plurality of voltages generated to said comparing means, said plurality of voltages each being set to a value higher than a limit voltage which is sufficiently low for allowing a normal operation of said load.

2. A direct-current power supply apparatus according to claim 1, wherein said plurality of voltages are set in such that a time period to be elapsed from when said indicator means indicates the warning condition to when the voltage output from said battery reaches the limit voltage is not significantly different depending on the types of the battery available.

3. A direct-current power supply apparatus according to claim 1, wherein said selecting means comprises switch means for manually selecting said plurality of voltages.

4. A direct-current power supply apparatus according to claim 1, wherein said battery available comprises identifying means for identifying the type of the battery, said selecting means selecting, when said battery is loaded in said housing means, a voltage associated with the type of the battery from said plurality of voltages in response to said identifying means.

5. A direct-current power supply apparatus according to claim 4, wherein said identifying means comprises a package for installing therein a specific type of battery,
   said selecting means comprising switch means disposed on said housing means for selecting, when said package is mounted in said housing means, an associated one of said plurality of voltages in response to the shape of said package.

6. A direct-current power supply apparatus according to claim 4, wherein said identifying means comprises conductor means for indicating that said battery is of a specific type, said selecting means comprising switch means disposed on said housing means for detecting, when said battery is loaded in said housing means, said conductor means to select an associated one of said plurality of voltages.

7. A direct-current power supply apparatus according to claim 4, wherein said identifying means comprises magnetic means for indicating that said battery is of a specific type, said selecting means comprising switch means disposed on said housing means for detecting, when said battery is loaded in said housing means, said magnetic means to select an associated one of said plurality of voltages.

* * * * *